(12) United States Patent
Haung

(10) Patent No.: US 12,516,667 B2
(45) Date of Patent: Jan. 6, 2026

(54) LIQUID PUMP UNIT WITH LATCH MECHANISM

(71) Applicant: COOLER MASTER CO., LTD., Taipei (TW)

(72) Inventor: Yu-Lun Haung, Taipei (TW)

(73) Assignee: COOLER MASTER CO., LTD., Taipei (TW)

(*) Notice: Subject to any disclaimer, the term of this patent is extended or adjusted under 35 U.S.C. 154(b) by 0 days.

(21) Appl. No.: 18/919,561

(22) Filed: Oct. 18, 2024

(65) Prior Publication Data
US 2025/0129777 A1  Apr. 24, 2025

(30) Foreign Application Priority Data
Oct. 18, 2023 (TW) ................................ 112211195

(51) Int. Cl.
*F04B 53/22* (2006.01)
*F04B 53/16* (2006.01)
(Continued)

(52) U.S. Cl.
CPC ............. *F04B 53/22* (2013.01); *F04B 53/16* (2013.01); *F04D 13/06* (2013.01); *F04D 13/0693* (2013.01); *F04D 29/406* (2013.01); *F04D 29/426* (2013.01); *F04D 29/5806* (2013.01); *F04D 29/588* (2013.01);
(Continued)

(58) Field of Classification Search
CPC .......... F04B 53/22; F04B 53/16; F04D 13/06; F04D 13/0693; F04D 29/406; F04D 29/426; F04D 29/5806; F04D 29/588; F04D 29/605; F04D 29/606; F04D 29/607; F04D 29/628; H05K 7/20272
See application file for complete search history.

(56) References Cited

U.S. PATENT DOCUMENTS 9,908,333 B2 * 3/2018 Gonzalez Perello .. B41J 2/1752
10,874,032 B2 * 12/2020 Leigh ................. H05K 7/20636
(Continued)

FOREIGN PATENT DOCUMENTS

WO  2021-229365 A1  11/2021

OTHER PUBLICATIONS

Patent publication and Machine translation for Korean Patent KR 10-2349558 B1, Title: Adapters for Connecting a Split-outlet Fluid Cartridge to a Single-inlet Mixed, and Related Methods, Published on Jan. 12, 2022. (Year: 2022).*

(Continued)

*Primary Examiner* — Mary A Davis
(74) *Attorney, Agent, or Firm* — Merchant & Gould P.C.

(57) ABSTRACT

A liquid pump unit includes a chassis with a tray box and a chassis box. The chassis box has a front opening, a back panel, and a bay for receiving the tray box. The back panel includes a chassis-outlet coupler, a chassis-inlet coupler, and at least one chassis-electrical connector. A pump assembly is mounted on the tray box and includes an outlet coupler, an inlet coupler, and at least one electrical connector, each removably connected to corresponding chassis couplers. A latch mechanism having a lever, bar, latch, and catch-pin secures the tray box within the chassis. The latch is rotatable to engage or release the catch-pin, allowing the latch mechanism to lock or release.

15 Claims, 6 Drawing Sheets

(51) Int. Cl.
- *F04D 13/06* (2006.01)
- *F04D 29/40* (2006.01)
- *F04D 29/42* (2006.01)
- *F04D 29/58* (2006.01)
- *F04D 29/60* (2006.01)
- *F04D 29/62* (2006.01)
- *H05K 7/20* (2006.01)

(52) U.S. Cl.
CPC ......... *F04D 29/605* (2013.01); *F04D 29/606* (2013.01); *F04D 29/607* (2013.01); *F04D 29/628* (2013.01); *H05K 7/20272* (2013.01)

(56) References Cited

U.S. PATENT DOCUMENTS

| | | | |
|---|---|---|---|
| 11,395,443 B2* | 7/2022 | Varela Benitez | H05K 7/20272 |
| 2022/0346271 A1 | 10/2022 | Chen et al. | |
| 2023/0059922 A1 | 2/2023 | Lin et al. | |
| 2023/0320040 A1 | 10/2023 | Chen et al. | |

OTHER PUBLICATIONS

European Search Report issued Mar. 17, 2025, in European Patent Application No. EP 24 20 7192.

\* cited by examiner

LIQUID PUMP UNIT WITH LATCH MECHANISM

CROSS-REFERENCE TO RELATED APPLICATIONS

This application is a non-provisional and claims priority under 35 U.S.C. § 119 to Taiwan Application No. 112211195, filed Oct. 18, 2023, the contents are hereby incorporated by reference in their entirety.

TECHNICAL FIELD

The present disclosure relates to liquid cooling systems, and more particular to liquid pump units for liquid cooling system.

BACKGROUND

Liquid cooling systems are commonly used for thermal management in various industries, including computing, data centers, electric vehicle (EV) fast charging, telecom, laser, and medical equipment. In data centers, in addition to air cooling, two main liquid cooling techniques are used for servers: cold plate cooling (also known as direct-to-chip cooling (DTC) or direct liquid cooling (DLC)) and immersion cooling.

Cold plate cooling involves directly mounting a cold plate onto heat sources such as CPUs, GPUs, or other integrated circuits. A working fluid within the cold plate chamber absorbs and transfers heat away from these components. In immersion cooling, integrated circuit components are submerged in a dielectric fluid, allowing heat to dissipate efficiently through direct thermal exchange with the fluid.

Coolant distribution units (CDUs) are responsible for circulating and pumping coolant in closed-loop systems within server racks and chassis for cold plate or immersion cooling, known as CDU loops or technology cooling systems (TCSs). In liquid-to-liquid CDUs, heat is transferred to a facility water system (FWS) via a heat exchanger, while in liquid-to-air CDUs, heat is dissipated into the ambient air through an internal heat exchanger.

To meet the increasing demands for heat dissipation, CDUs continuously monitor and control the temperature, pressure, and flow rate of the cooling loop to ensure efficient, near-continuous operation of the electronics. Maintenance and replacement of key CDU components are crucial to minimize or avoid system downtime. Key components include pumps, heat exchangers, microprocessor controls, water quality systems, and coolant pipes. Pump maintenance and replacement are often the most challenging and time-consuming tasks. As server racks and CDUs are packed into increasingly tighter spaces, accessing and servicing the CDU pump unit becomes even more difficult.

The entire CDU must be removed from the server rack to maintain or replace a CDU pump unit. This process involves several cumbersome steps. First, all fasteners must be removed, followed by disconnecting external pipes and decoupling electrical connections. Only then can the CDU be placed in a workspace. After that, covers or plates must be removed to access the pump unit. Internal fasteners must then be detached, input and output pipes decoupled, and at least one electrical connection disconnected before the pump can be removed for maintenance or replacement. This process is time-consuming and involves many disassembling steps, increasing the risk of lost parts and extended system downtime.

SUMMARY

The present disclosure provides a liquid pump unit designed for quick and efficient insertion and removal from coolant distribution units. The pump unit can be securely latched in a closed position during operation and quickly released to a removable position when maintenance or replacement is needed, ensuring safety and convenience.

In one embodiment of the present disclosure, a liquid pump unit includes a chassis having a tray box and a chassis box that includes a front opening, a back panel and a bay that is defined by the front opening and the back panel and is configured to receive the tray box, the back panel further including a chassis-outlet, a chassis-inlet coupler and at least one chassis-electrical connector, a pump assembly that is mounted on the tray box, having a pump, an outlet coupler, an inlet coupler and at least one electrical connector, where the outlet coupler can be removably connected to the chassis-outlet coupler, the inlet coupler can be removably connected to the chassis-inlet coupler, and the electrical connector can be removably connected to the chassis-electrical connector, and at least one latch mechanism having a lever, a bar, a latch and a catch-pin, where the lever is rotatably connected to a first end of the bar, the latch is rotatably connected to a second end of the bar and is configured to engage with the catch-pin and release from the catch-pin through rotation, wherein when the latch engages the catch-pin, the latch mechanism is locked in a closed position, and when the latch releases the catch-pin, the latch mechanism moves into a released position.

In one embodiment of the present disclosure, when the latch mechanism is locked in a closed position, the outlet coupler is connected to the chassis-outlet coupler, the inlet coupler is connected to the chassis-inlet coupler, and the electrical connector is connected to the chassis-electrical connector.

In one embodiment of the present disclosure, when the latch mechanism moves into a released position, the outlet coupler is disconnected from the chassis-outlet coupler, the inlet coupler is disconnected from the chassis-inlet coupler, and the electrical connector is disconnected from the chassis-electrical connector.

In one embodiment of the present disclosure, the tray box including at least one inner panel assembly that has a front end and a rear end opposite to the front end, the front end extending outward from the tray box through the front opening, the lever is rotatably coupled to the bar at a lever-bar pivot joint, the latch is rotatably coupled to the bar at a latch-bar pivot joint, and the lever is further rotatably coupled to the front end at a lever-fixed pivot point and the latch is further rotatably coupled to the rear end at a latch-fixed pivot point, and when the latch mechanism is in the closed position, the lever-bar pivot joint is inside the tray box, and when the latch mechanism is in the released position, the lever-bar pivot joint extends outside the tray box through the front opening.

In one embodiment of the present disclosure, the lever includes a lever-arm and a shorter lever-arm coupled to the lever-arm, the latch includes a latch-arm and a hook coupled to the latch-arm, and the catch-pin includes a retaining cut-out, when the latch mechanism is in the closed position, the hook engages the retaining cut-out, and when the latch mechanism is in the released position, the hook is released from the retaining cut-out.

In one embodiment of the present disclosure, the chassis has a length and a height shorter than the length, and the catch pin protruding from the back panel has a pin length shorter than the height.

In one embodiment of the present disclosure, when the latch engages the catch-pin, a resistive force is created and opposes a removal direction of the chassis-box in the chassis, and when the latch is released from the catch-pin, the chassis-box is free to move in the removal direction.

In one embodiment of the present disclosure, the pump assembly is positioned between two latch mechanisms.

In one embodiment of the present disclosure, the latch mechanism includes a handle that is coupled to each lever of the two latch mechanisms on respective ends of each lever.

In one embodiment of the present disclosure, the chassis box and the tray box are in cuboid shape.

In one embodiment of the present disclosure, the tray box is designed to be received by the bay, and a fit between the tray box and the bay is a transition fit.

In one embodiment of the present disclosure, a controller and a pump-driver circuit are electrically coupled to the electrical connector to control the operation of the pump.

In one embodiment of the present disclosure, a fan device coupled to the pump on one end opposite the outlet and the inlet is aligned with the fan opening at the front opening.

In one embodiment of the present disclosure, the pump includes an outlet, an inlet, an outlet pipe, and an inlet pipe, the inlet and the outlet being connected to the pump, the outlet pipe has a first end connected to the outlet and a second end connected to the outlet coupler, and the inlet pipe has a first end connected to the inlet and a second end connected to the inlet coupler.

BRIEF DESCRIPTION OF THE DRAWINGS

Unless otherwise noted, the accompanying drawings depict various aspects of the innovative subject matter. The drawings use reference numerals to identify similar components across the different views. Several examples of liquid pump units incorporating the principles of this disclosure are provided for illustrative purposes, not as limitations.

DETAILED DESCRIPTION

The following describes various principles relating to the components and assemblies for cooling electronic devices, regarding specific examples of liquid pump units. These examples illustrate innovative concepts through particular chassis, pump assemblies, and latch mechanism configurations. More specifically, but not exclusively, these principles are demonstrated in examples involving the positioning, coupling or connecting, and decoupling or disconnecting of pump assembly components with the chassis and the interlocking and release mechanisms between the pump assembly and chassis. For brevity and clarity, well-known functions and structures are not detailed. However, the disclosed principles can be applied to other embodiments involving component positioning, coupling, decoupling, and interlocking, allowing for various performance outcomes and characteristics.

Therefore, other types of chassis, pump assemblies, and latch mechanisms with different characteristics than those described in the specific examples can also incorporate the innovative principles outlined. These designs may be applicable in scenarios beyond the scope of the examples provided here. As a result, variations of chassis, pump assemblies, and latch mechanisms not explicitly outlined in this disclosure are still considered to be within its scope, as understood by those skilled in the relevant field after reviewing this description.

The disclosed embodiments direct to liquid pump units designed for coolant distribution units (CDUs) of cooling systems that dissipate high heat loads. CDUs may be installed in server racks and chassis or integrated into cooling systems designed to manage heat generated by electronic components. These cooling systems typically include at least one liquid pump unit with one or more liquid-based cooling loops. The liquid pump unit may be attached to the rack or chassis using fasteners (e.g., bolts, screws), facilitating the transport of coolant to the heat-generating electronic components.

Figure 1A:
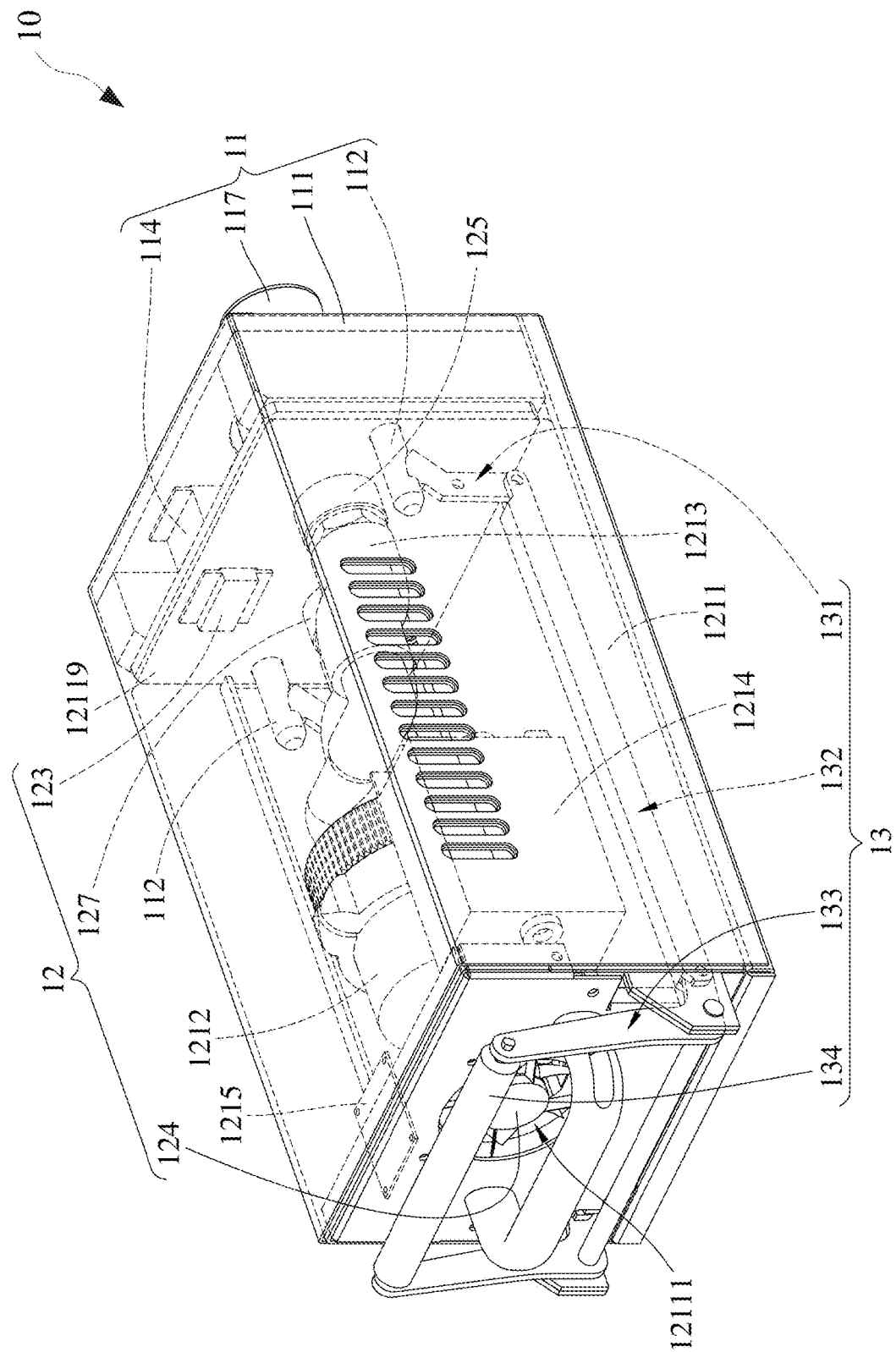
FIG. 1A illustrates a perspective internal view of a liquid pump unit, in accordance with one embodiment of the present disclosure.
Figure 1B:
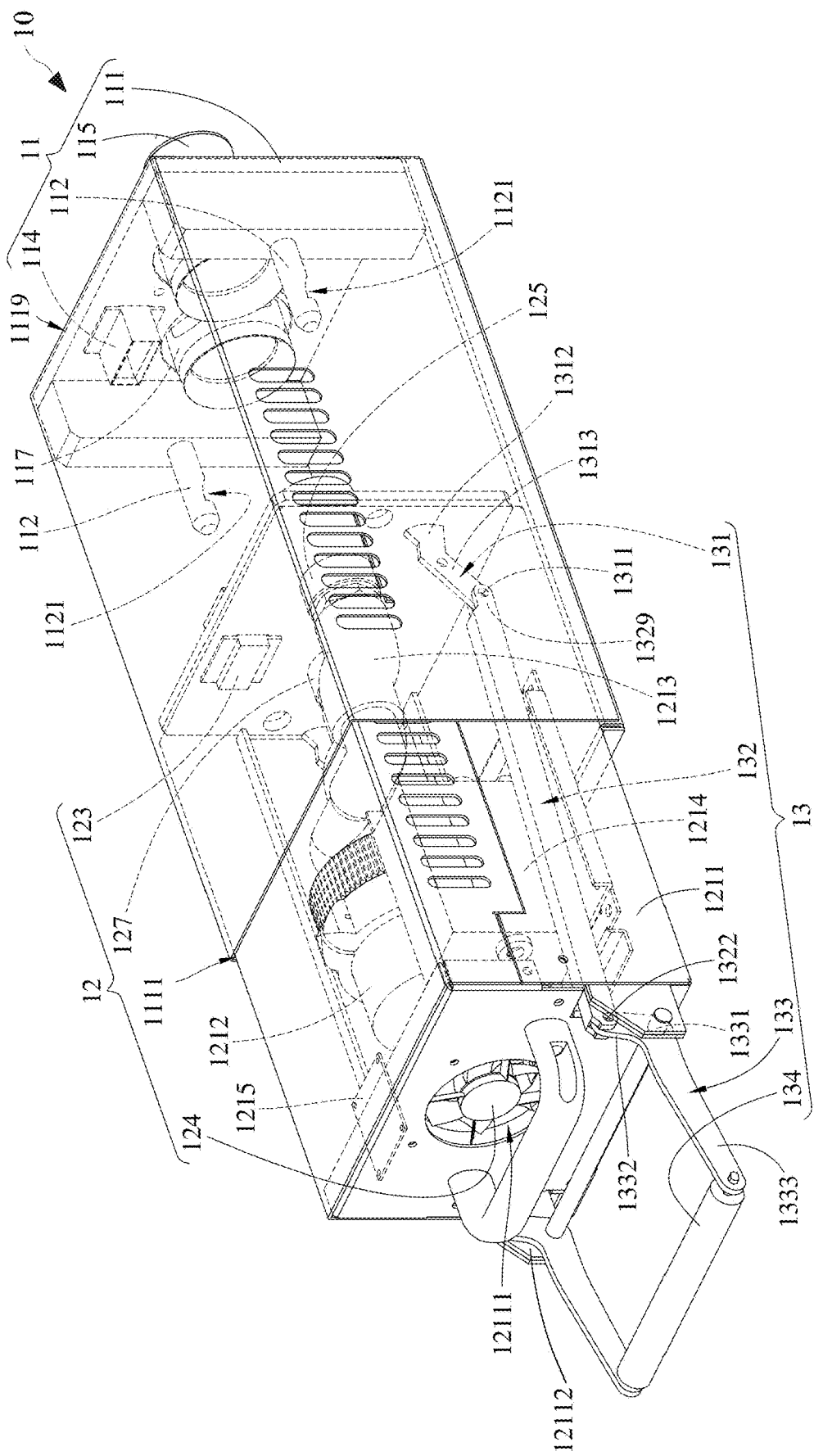
FIG. 1B illustrates another internal perspective view of the liquid pump unit of FIG. 1A, in accordance with one embodiment of the present disclosure.
Figure 2:
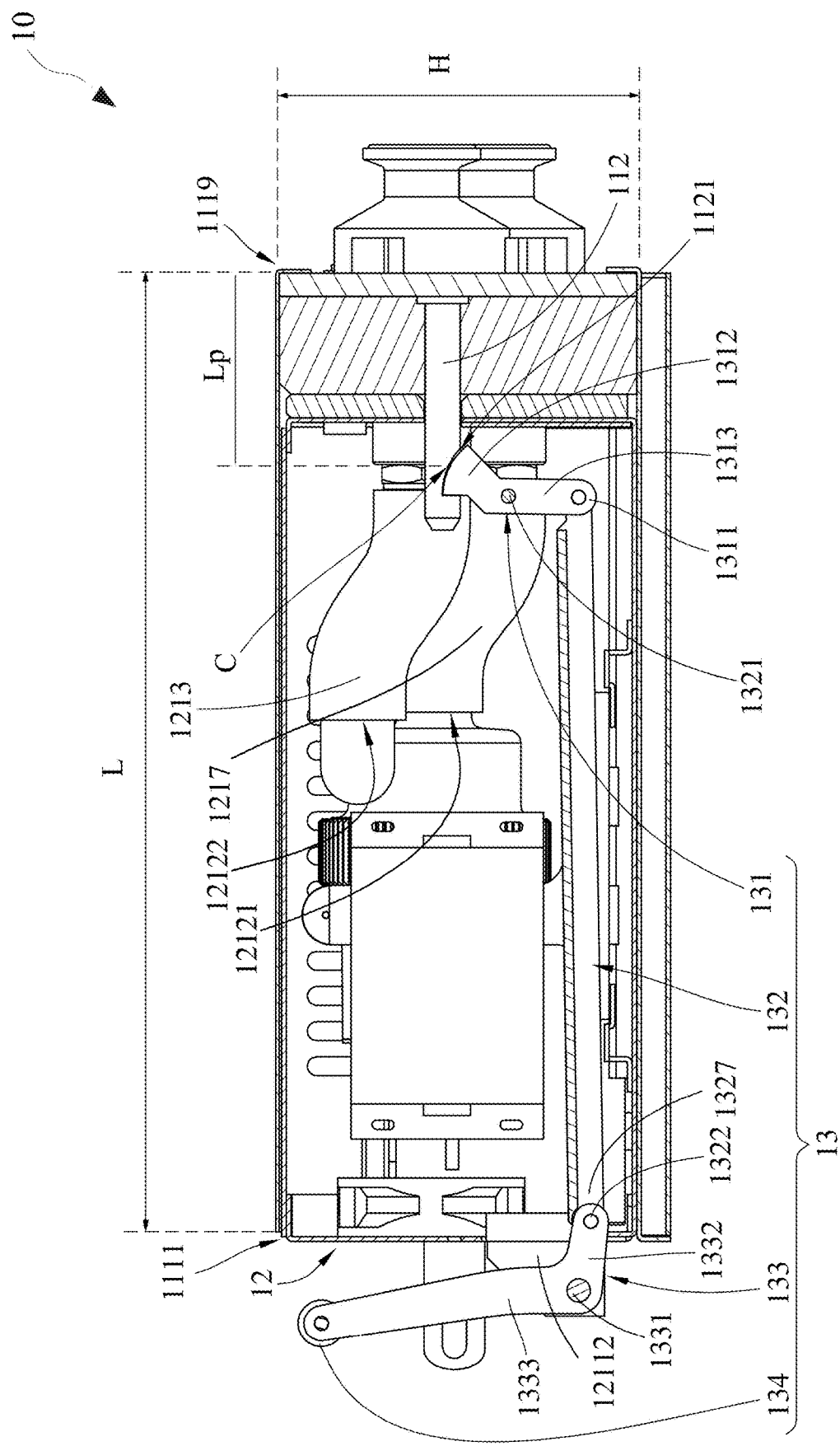
FIG. 2 illustrates a cross-section view of the liquid pump unit of FIG. 1A, in accordance with one embodiment of the present disclosure.

FIGS. 1A to 2 illustrate a liquid pump unit 10 in accordance with one embodiment of the present disclosure. FIG. 1A illustrates a perspective view of a liquid pump 10 in a closed position. FIG. 1B illustrates a perspective view of a liquid pump 10 in a released position. FIG. 2 illustrates a cross-sectional view of a liquid pump 10 in a closed position.

The liquid pump unit 10 includes a chassis 11, a pump assembly 12, and at least one latch mechanism 13. The chassis 11 includes a chassis box 111 and a tray box 1211. The chassis box 111 includes a front opening 1111 and a back panel 1119, defining a bay configured to receive the tray box 1211. The back panel 1119 includes a chassis-outlet coupler 115, a chassis-inlet coupler 117, and at least one chassis-electrical connector 114.

The pump assembly 12 is mounted on the tray box 1211 and includes a pump 1212, an outlet coupler 125, an inlet coupler 127, and at least one electrical connector 123. Each of these components included in the pump assembly 12 is coupled to the tray-back panel 12119. The outlet coupler 125 can be either fluidly connected to the chassis-outlet coupler 115 or disconnected from it, while the inlet coupler 127 can be either fluidly connected to the chassis-inlet coupler 117 or disconnected from it. The electrical connector 123 can be either electrically connected to the corresponding chassis-electrical connector 114 or disconnected from it.

The latch mechanism 13 includes a lever 133, a bar 132, a latch 131, and a catch-pin 112. The lever 133 is rotatably connected to a first end of the bar 132, and the latch 131 is rotatably connected to a second of the bar 132. The latch 131 is designed to engage with the catch-pin 112 and release from it through rotation. When the latch 131 engages the catch-pin 112, the latch mechanism 13 is locked in a closed position. Accordingly, the outlet coupler 125 is fluidly connected to the chassis-outlet coupler 115, the inlet coupler 127 is fluidly connected to the chassis-inlet coupler 117, and the electrical connector 123 is electrically connected to the corresponding chassis-electrical connector 114. When the latch 131 is rotated to release from the catch-pin 112, the latch mechanism 13 moves into a released position, disconnecting all the aforementioned connections.

In one embodiment, the chassis box 111 and the tray box 1211 can be cuboid in shape. The tray box 1211 is designed to be received by the bay, with the fit between the tray box and the bay configured as a transition fit. The transition fit ensures a balanced connection which allows for a secure retention during operation while facilitating easy removal for maintenance or replacement without the need for excessive force. However, the embodiment is not limited thereto. In other embodiments, other types of fits may be employed depending on the different demands. For example, a clearance fit may be used to allow effortless insertion and removal of the tray box with minimal resistance, ideal for applications requiring frequent access. Additionally, an interference fit may be used to create a more permanent or vibration resistant connection, where the tray box is securely pressed into the bay, limiting movement during operation.

In one embodiment, the pump 1212 includes an inlet 12121, an outlet 12122, an inlet pipe 1217, and an outlet pipe 1213. The inlet 12121 and the outlet 12122 are fluidly connected to the pump 1212, allowing fluid to enter and exit the pump. The inlet pipe 1217 is fluidly connected to the inlet 12121 at one end and to the inlet coupler 127 at the opposite end. Similarly, the outlet pipe 1213 is fluidly connected to the outlet 12122 at one end and to the outlet coupler 125 at the opposite end, ensuring proper fluid communication for the system.

In one embodiment, the liquid pump unit 10 also includes a fan device 124 and a fan opening 12111. The fan device 124 is coupled to the pump unit 1212 on one end opposite the outlet 12122 and the inlet 12121, and is aligned with the fan opening 12111 located at the front opening 1111 of the chassis box 111. The fan device 124 functions as an air-cooled heat exchanger, designed to cool the pump 1212 during operation by facilitating airflow through the fan opening 12111.

In one embodiment, the liquid pump unit 10 further includes a controller 1215 and a pump-driver circuit 1214. Both the controller 1215 and the pump-driver circuit 1214 are electrically connected to the electrical connector 123 and are responsible for controlling the operation of the pump 1212. The controller 1215 transmits control signals to the pump-driver circuit 1214, which adjusts the pressure and flow rate of the pump 1212. This regulation enables efficient and continuous, or near-continuous, operation of a cooling distribution unit (CDU) loop, ensuring the proper functioning of connected electronic systems.

In one embodiment, the tray box 1211 includes at least one inner panel assembly 12112 with a front end 1327 and a rear end 1329 opposite to the front end. A lever 133 is rotatably coupled to a bar 132 at a lever-bar pivot joint 1322, while a latch 131 is rotatably coupled to the bar 132 at a latch-bar pivot joint 1311. The lever 133 is further rotatably coupled to the front end 1327 at a lever-fixed pivot joint 1331, and the latch 131 is rotatably coupled to the rear end 1329 at a latch-fixed pivot joint 1321. The front end 1327 extends outward from the tray box 1211 through the front opening 1111. When the latch mechanism 13 is in the closed position, the lever-bar pivot joint 1322 is inside the tray box 1211. When the latch mechanism 13 is in the released position, the lever-bar pivot joint 1322 extends outside the tray box 1211 through the front opening 1111.

In one embodiment, the lever 133 includes a lever-arm 1333 and a shorter lever-arm 1332 coupled to the lever-arm 1333 to form an L-shape. The latch 131 includes a latch-arm 1313 and a hook 1312 that is shaped like a rockaway axe head and coupled to the latch-arm 1313. The catch-pin 112 includes a retaining cut-out 1121. When the latch mechanism 13 is in the closed position, the hook 1312 engages the retaining cut-out 1121. When the latch mechanism 13 is in the released position, the hook 1312 is released from the retaining cut-out 1121. In one embodiment, when the latch 131 engages the catch-pin 112, a resistive force opposes the removal direction R (as shown in FIG. 3C) of the chassis box 111 in the chassis 11. When the latch 131 is released from the catch-pin 112, the chassis box 111 is free to move in the removal direction R.

In one embodiment, the chassis 11 has a height H (measured from a bottom plate to a top plate of the chassis 11) and a length L (measured from the back panel 1119 to the front opening 1111), and a catch-pin 112 protrudes perpendicularly from the back panel 1119. The catch-pin 112 has a pin length Lp, measured from the back panel 1119 to the center C of the retaining cut-out 1121. The length L is greater than the height H, and the height H is greater than the pin length Lp.

In one embodiment, the pump assembly 12 is positioned between two latch mechanisms 13. In another embodiment, the latch mechanism 13 includes a handle 134. The handle 134 is coupled to the levers 133 of both latch mechanisms 13 at respective ends of each lever 133, allowing for simultaneous operation of the latch mechanisms 13.

Figure 3A:
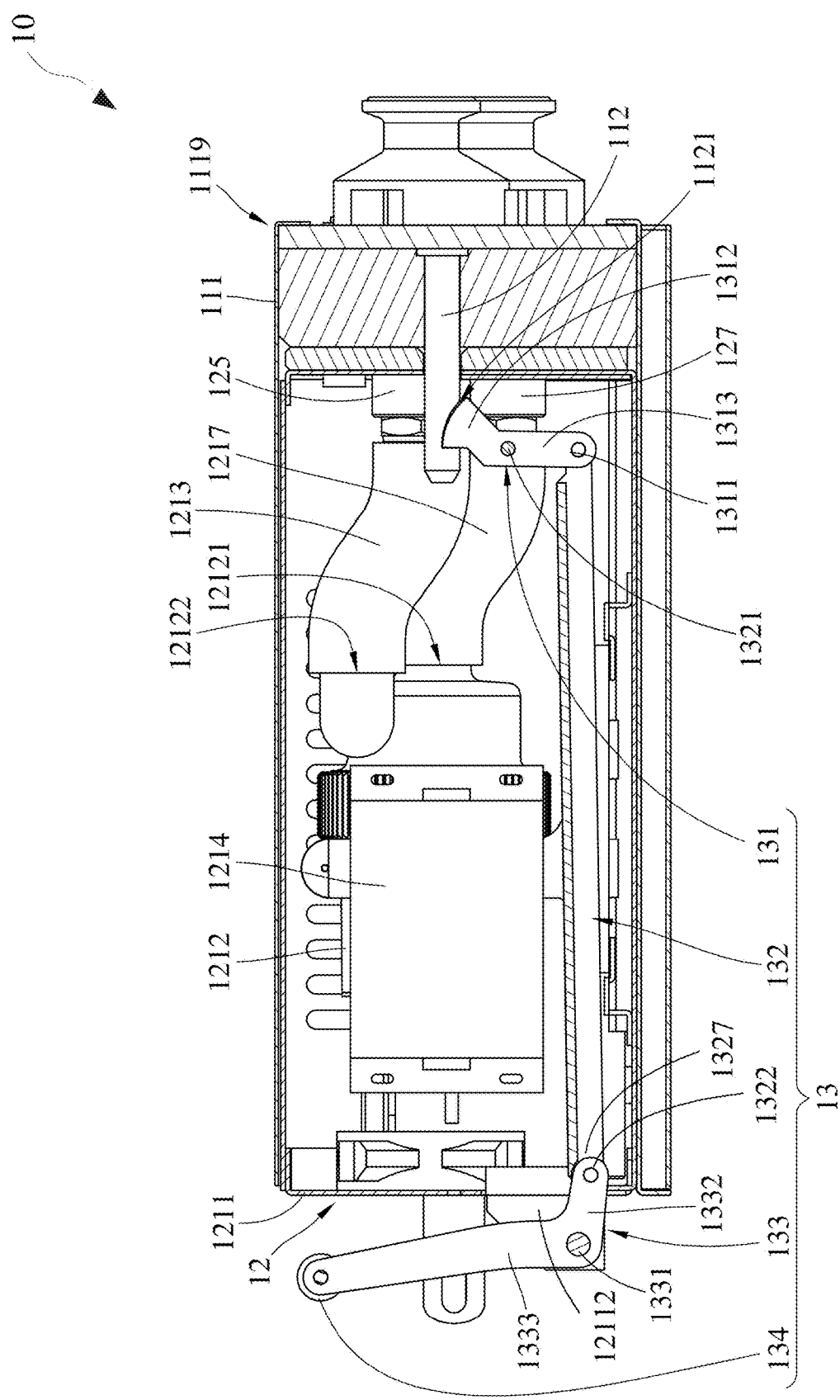
FIG. 3A illustrates a cross-section view of the liquid pump unit of FIG. 1A in a closed position, in accordance with one embodiment of the present disclosure.
Figure 3B:
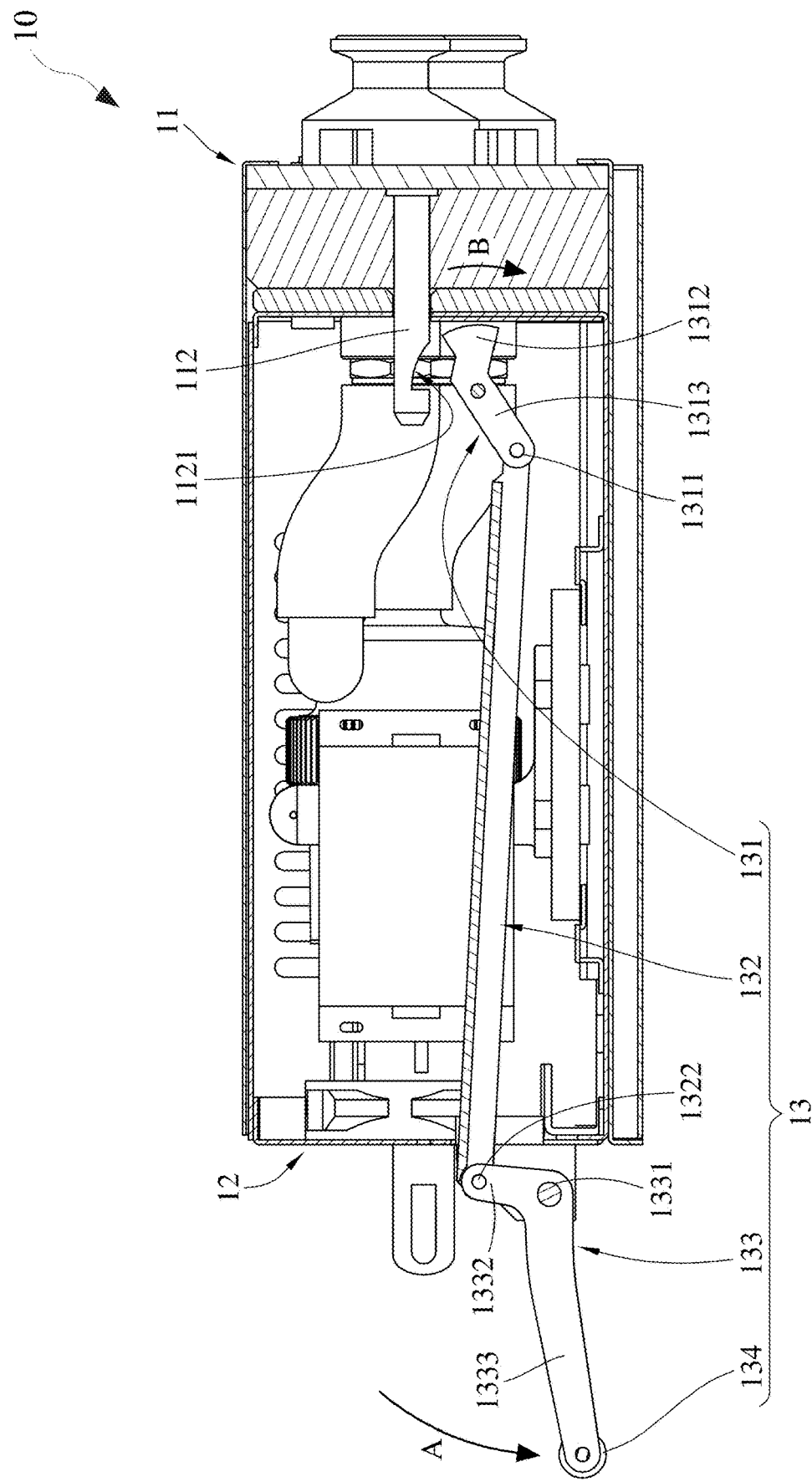
FIG. 3B illustrates a cross-section view of the liquid pump unit of FIG. 1A in a unlocked position, in accordance with one embodiment of the present disclosure.
Figure 3C:
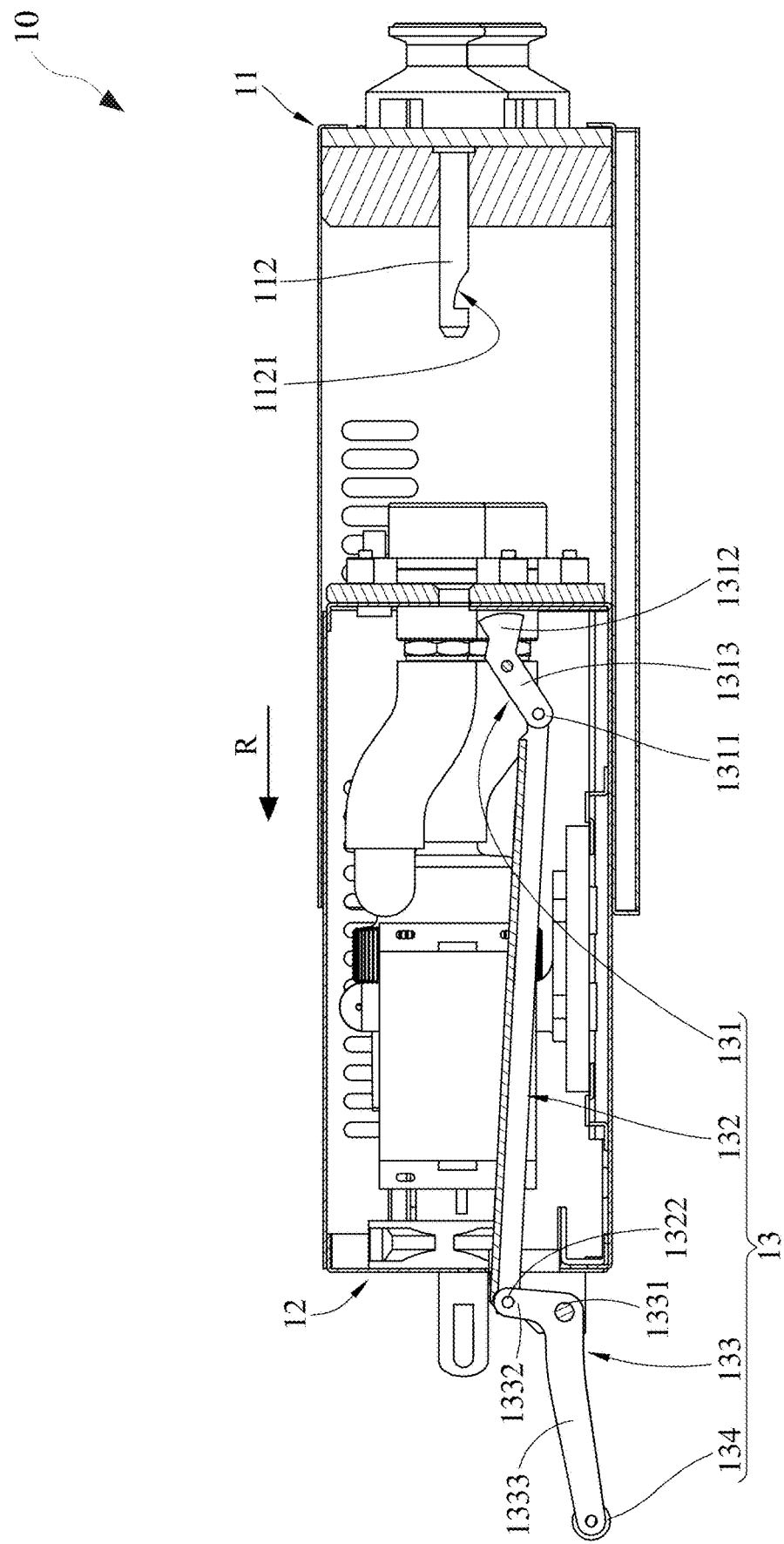
FIG. 3C illustrates a cross-section view of the liquid pump unit of FIG. 1A in a released position, in accordance with one embodiment of the present disclosure.

FIGS. 3A to 3C illustrates a cross-section view of the liquid pump unit 10 in different positions, in accordance with various embodiments of the present disclosure. FIG. 3A illustrates a cross-section view of the liquid pump unit 10 of FIG. 1A in a closed position. FIG. 3B illustrates a cross-section view of the liquid pump unit 10 of FIG. 1A in a unlocked position. FIG. 3C illustrates a cross-section view of the liquid pump unit 10 of FIG. 1A in a released position, in accordance with one embodiment of the present disclosure.

When the pump unit 10 is in the closed position, the outlet coupler 125 is fluidly connected to the chassis-outlet coupler 115, the inlet coupler 127 is fluidly connected to the chassis-inlet coupler 117, and the electrical connector 123 is electrically connected to the chassis-electrical connector 114. From a side view, the lever 133 positioned on the left, the lever 133 on the left and the upright handle 134 form an L-shaped component. The hook 1312 is securely engaged with the retaining cut-out 1121, substantially locking into place.

The resistive force of the latch mechanism 13 opposes the removal direction R of the chassis box 111 in the chassis 11. The removal direction R refers to the movement of the tray-back panel 12119 away from the back panel 1119. While in the closed position, the connection between the outlet coupler 125 and chassis-outlet coupler 115, the inlet coupler 127 and chassis-inlet coupler 117, and the electrical connector 123 and chassis-electrical connector 114 remains securely maintained.

When the lever 133 is rotated to release the hook 1312 from the retaining cut-out 1121, the handle 134 rotates in direction A, as shown in FIG. 3B, moving away from the front opening 1111 and curving downward. Simultaneously, the hook 1312 rotates in a direction B opposite the rotating direction of the handle 134. In the unlocked position, the lever-bar pivot joint 1322 is rotated outside of the tray box 1211 through the front opening 1111, and the hook 1312 is fully released from the retaining cut-out 1121.

In the released position, the transition fit between the chassis box 111 and tray box 1211 allows sufficient clearance for the tray box 1211 to slide within the chassis box 111. The tray box 1211 is then moved in the removal direction R, which disconnects the outlet coupler 125 from the chassis-outlet coupler 115, the inlet coupler 127 from the chassis-inlet coupler 117, and the electrical connector 123 from the chassis-electrical connector 114. Once the tray box 1211 is fully removed from the chassis box 111, the pump assembly 12 can be extracted from the tray box 1211.

The embodiments of the liquid pump units 10 provide efficient and secure installation, removal, and connecting of the pump assemblies 12 to the chassis-boxes 111 of coolant distribution units (CDUs) fastened on racks or server chassis. The benefit can be achieved through the transition fit and latch mechanisms 13. The design reduces the number of installation and removal steps, as well as the need for fastening and unfastening components, while ensuring a safe and secure latching mechanism 13.

The transition fit between the chassis box 111 and the tray box 1211 allows for smooth sliding of the tray box 1211 within the chassis box 111. Accordingly, it is easier to accurately and safely align the outlet coupler 125 with the chassis-outlet coupler 115, the inlet coupler 127 with the chassis-inlet coupler 117, and the electrical connector 123 with the chassis-electrical connector 114. Only the chassis box 111 is fastened to the CDU that is mounted on a rack or server chassis. As a result, the entire CDU does not need to be removed when servicing or replacing the pump assembly 12, thereby reducing the number of steps and minimizing the unfastening of parts.

Due to the reduced installation and removal steps, the design saves time and reduces the risk of lost parts, minimizing system downtime in electronic systems equipped with cooling systems using CDUs. The manual disconnecting of internal and external piping and electrical disconnections between the pump assembly 12 and external devices or power sources is eliminated. The outlet coupler 125, inlet coupler 127, and electrical connector 123 automatically connect with their chassis counterparts by pushing when the latch mechanism 13 engages the hook 1312 with the retaining cut-out 1121.

Further, the lever 133 is rotatably connected to the front end 1327 at the lever-fixed pivot joint 1331, and the latch 131 is rotatably connected to the rear end 1329 at the latch-fixed pivot joint 1321, creating a resistive force when the hook 1312 engages the retaining cut-out 1121. The resistive force opposes movement in the removal direction R along the length L of the chassis box 111, ensuring that the outlet coupler 125, inlet coupler 127, and electrical connector 123 remain securely coupled.

Additionally, the presence of two latch mechanisms 13, with the pump assembly 12 positioned between them, further strengthens the closed position of the tray-box 1211 that holds the pump assembly 12. This additional support hinders any movement between the couplers and connectors, ensuring a stable and secure connection.

In summary, the design simplifies installation and removal processes, saves time, and makes maintenance, repair, and part replacement of the pump assemblies 12 more convenient and efficient.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those of ordinary skill in the relevant art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. Of course, the disclosed embodiments are merely exemplary embodiments and that various modifications can be made without departing from the spirit and scope of the disclosure. Further, it should be understood that various aspects of the embodiment are not mutually exclusive of each other and can be combined as desired by a person of ordinary skill in the art as a matter of design choices.

The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some number. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces.

What is claimed is:

1. A liquid pump unit, comprising:
   a chassis having a tray box and a chassis box that includes a front opening, a back panel and a bay that is defined by the front opening and the back panel and is configured to receive the tray box, the back panel further including a chassis-outlet coupler, a chassis-inlet coupler and at least one chassis-electrical connector;
   a pump assembly that is mounted on the tray box, having a pump, an outlet coupler, an inlet coupler and at least one electrical connector, where the outlet coupler can be removably connected to the chassis-outlet coupler, the inlet coupler can be removably connected to the chassis-inlet coupler, and the at least one electrical connector can be removably connected to the at least one chassis-electrical connector; and
   at least one latch mechanism having a lever, a bar, a latch and a catch-pin that protrudes from the back panel of the chassis box, where the lever is rotatably connected to a first end of the bar, the latch is rotatably connected to a second end of the bar and is configured to engage with the catch-pin and release from the catch-pin through rotation, wherein
   when the latch engages the catch-pin, the at least one latch mechanism is locked in a closed position, and when the latch releases the catch-pin, the at least one latch mechanism moves into a released position.

2. The liquid pump unit of claim 1, wherein
when the at least one latch mechanism is locked in a closed position, the outlet coupler is connected to the chassis-outlet coupler, the inlet coupler is connected to the chassis-inlet coupler, and the at least one electrical connector is connected to the at least one chassis-electrical connector.

3. The liquid pump unit of claim 1, wherein
when the at least one latch mechanism moves into a released position, the outlet coupler is disconnected from the chassis-outlet coupler, the inlet coupler is disconnected from the chassis-inlet coupler, and the at least one electrical connector is disconnected from the at least one chassis-electrical connector.

4. The liquid pump unit of claim 1, wherein
the tray box including at least one inner panel assembly that has a front end and a rear end opposite to the front end, the front end extending outward from the tray box through the front opening,
the lever is rotatably coupled to the bar at a lever-bar pivot joint, the latch is rotatably coupled to the bar at a latch-bar pivot joint, and the lever is further rotatably coupled to the front end at a lever-fixed pivot point and the latch is further rotatably coupled to the rear end at a latch-fixed pivot point, and
when the at least one latch mechanism is in the closed position, the lever-bar pivot joint is inside the tray box, and when the at least one latch mechanism is in the released position, the lever-bar pivot joint extends outside the tray box through the front opening.

5. The liquid pump unit of claim 4, wherein
the lever includes a lever-arm and a shorter lever-arm coupled to the lever-arm, the latch includes a latch-arm and a hook coupled to the latch-arm, and the catch-pin includes a retaining cut-out, and
when the at least one latch mechanism is in the closed position, the hook engages the retaining cut-out, and when the at least one latch mechanism is in the released position, the hook is released from the retaining cut-out.

6. The liquid pump unit of claim 1, wherein
the chassis has a length and a height shorter than the length, and the catch-pin has a pin length shorter than the height.

7. The liquid pump unit of claim 1, wherein
when the latch engages the catch-pin, a resistive force is created and opposes a removal direction of the tray box in the chassis, and when the latch is released from the catch-pin, the tray box is free to move in the removal direction.

8. The liquid pump unit of claim 1, wherein
the at least one latch mechanism includes two latch mechanisms, the pump assembly being positioned between the two latch mechanisms.

9. The liquid pump unit of claim 8, wherein
each of the two latch mechanisms includes a lever, and a handle that is coupled to the levers at respective ends.

10. The liquid pump unit of claim 1, wherein
the chassis box and the tray box are in cuboid shape.

11. The liquid pump unit of claim 1, wherein
the tray box is designed to be received by the bay, and a fit between the tray box and the bay is a transition fit.

12. The liquid pump unit of claim 1, wherein
a controller and a pump-driver circuit are electrically coupled to the at least one electrical connector to control the operation of the pump.

13. The liquid pump unit of claim 1, wherein
the pump includes an outlet, an inlet, an outlet pipe, and an inlet pipe, the inlet and the outlet being connected to the pump,
the outlet pipe has a first end connected to the outlet and a second end connected to the outlet coupler, and
the inlet pipe has a first end connected to the inlet and a second end connected to the inlet coupler.

14. The liquid pump unit of claim 13, wherein the liquid pump unit further includes a fan device and a fan opening.

15. The liquid pump unit of claim 14, wherein the fan device coupled to the pump on one end opposite the outlet and the inlet is aligned with the fan opening at the front opening.

* * * * *